United States Patent
Yokochi et al.

(10) Patent No.: US 7,061,599 B2
(45) Date of Patent: Jun. 13, 2006

(54) PROTECTIVE FILM FOR BASE SUBSTRATES OF MULTI-LAYERED BOARD AND METHOD AND APPARATUS FOR INSPECTING BASE SUBSTRATES

(75) Inventors: Tomohiro Yokochi, Kariya (JP); Yoshitaro Yazaki, Anjo (JP); Hiroshi Nagasaka, Handa (JP)

(73) Assignee: Denso Corporation, Kariya (JP)

( * ) Notice: Subject to any disclaimer, the term of this patent is extended or adjusted under 35 U.S.C. 154(b) by 389 days.

(21) Appl. No.: 10/465,821

(22) Filed: Jun. 20, 2003

(65) Prior Publication Data

US 2004/0037966 A1 Feb. 26, 2004

(30) Foreign Application Priority Data

Jul. 3, 2002 (JP) .............................. 2002-195074

(51) Int. Cl.
*G01N 21/00* (2006.01)

(52) U.S. Cl. .............................. 356/237.1; 356/237.2; 356/241.1; 356/241.5

(58) Field of Classification Search ............. 356/237.1, 356/241.1, 241.5, 237.2; 382/145, 147
See application file for complete search history.

(56) References Cited

U.S. PATENT DOCUMENTS

| | | | | |
|---|---|---|---|---|
| 3,922,097 A | * | 11/1975 | Nachet | 356/241.1 |
| 4,145,714 A | * | 3/1979 | MacDonald et al. | 348/131 |
| 4,560,273 A | * | 12/1985 | Ando et al. | 356/237.6 |
| 5,544,773 A | * | 8/1996 | Haruta et al. | 216/13 |
| 6,217,988 B1 | * | 4/2001 | Yasue et al. | 428/209 |
| 6,228,465 B1 | * | 5/2001 | Takiguchi et al. | 428/209 |
| 6,262,579 B1 | * | 7/2001 | Chazan et al. | 324/537 |

* cited by examiner

*Primary Examiner*—Gregory J. Toatley, Jr.
*Assistant Examiner*—Roy M. Punnoose
(74) *Attorney, Agent, or Firm*—Posz Law Group, PLC

(57) ABSTRACT

An inspection apparatus for a base substrate of a multi-layered board irradiates light to the base substrate of a multilayered board to which a protective film is attached. An image of a surface, to which the protective film is attached, is picturized by a camera, so that an acceptability of a state of a via hole is inspected on the basis of a difference between a light reflectivity of the via hole and a light reflectivity of the protective film. The protective film is colored so as to lower its light reflectivity so that the difference between the light reflectivity of the via hole and that of the protective film is clearly generated. Accordingly, on the basis of the image picturized by the camera, the size of the via hole, dusts therein and the acceptability of the via hole can be accurately inspected.

13 Claims, 3 Drawing Sheets

PROTECTIVE FILM FOR BASE SUBSTRATES OF MULTI-LAYERED BOARD AND METHOD AND APPARATUS FOR INSPECTING BASE SUBSTRATES

CROSS REFERENCE TO RELATED APPLICATION

This application is based on and incorporates herein by reference Japanese Patent Application No. 2002-195074 filed on Jul. 3, 2002.

FIELD OF THE INVENTION

The present invention relates to a protective film, which protects a base substrate of a multi-layered board when bottomed holes are formed on the base substrate of the multi-layered board or when the bottomed holes are filled with interlayer connective material, such as conductive paste, an inspection apparatus and an inspection method for the base substrate of the multi-layered board applied with the protective film.

BACKGROUND OF THE INVENTION

In producing a multi-layered board, conductive patterns are formed on one surface of a resin sheet, serving as a base substrate of the multi-layered board, and via holes are formed on the other surface of the resin sheet so that the bottoms of the via holes should be the conductive patterns, and the via holes are filled with conductive paste. A plurality of resin sheets, in which the conductive patterns have been formed and the via holes have been filled with the conductive paste, are laminated and bonded together, so that one multi-layered board is formed. In these processes, inside the multi-layered board, each interlayer connection between adjoining conductive pattern layers is performed through the use of the conductive paste.

In such conductive paste filling processes, when the via holes are filled with the conductive paste, the conductive paste tends to adhered to a part of the resin sheet other than the via holes. Moreover, the resin sheet is likely to be damaged in such conductive paste filling operations. To prevent these troubles, a protective film is laminated on a surface of each resin sheet. This surface is on a side from which the conductive paste is filled into the via holes.

The via holes are formed, for example, by means of laser irradiation into the protective film and the resin sheet after the protective film is laminated on the resin sheet. Accordingly, penetration holes, the positions of which correspond to those of the via holes of the resin sheet, are formed in the protective film, and so the conductive paste is filled in the via holes of the resin sheet through the penetration holes.

In that process, when the via hole has a dust therein, or when the via hole is not formed to have a diameter in a predetermined size, the interlayer connections among the conductive patterns are likely to be performed sufficiently. Moreover, the via holes are poured with the conductive paste. In case the poured amount of the conductive paste is not sufficient, the interlayer connections are likely to become defective.

Accordingly, after the via holes are formed, or the conductive paste is poured, it is desired that the states of the via holes and filled degrees of the conductive paste are inspected by means of image recognition technology so as to reliably perform the interlayer connections.

However, a resin film, for example made of polyethylene terephthalate, is employed as the protective film so as to be easily laminated and detached. Such a resin film is transparent or white and therefore has high light reflectivity. Accordingly, contrast between the resin film and the conductive patterns on the bottom of the via holes, or that between the resin film and the conductive paste filling the via holes, is lowered. Therefore, it is difficult to recognize the shapes of the via holes, dusts therein, inadequate fillings of the conductive paste thereinto, and so on by means of the image recognition technology.

SUMMARY OF THE INVENTION

In view of the above disadvantages, the purpose of this invention is to provide a protective film for protecting a base substrate of a multi-layered board, an inspection apparatus and an inspection method for inspecting the base substrate of the multi-layered board, by increasing contrast between the protective film and bottomed holes, so that the bottomed holes can be accurately inspected by means of image recognition technology.

According to this invention, to attain the above purpose, a protective film for protecting a base substrate of a multi-layered board is laminated on one surface of the base substrate of the multi-layered board, the surface being opposite from the surface in which the conductive patterns are formed. Moreover, from the one surface of the base substrate of the multi-layered board, laminated with protective film, the bottomed holes are formed, and thereafter the bottomed holes are filled with interlayer connective material. The protective film is colored with a color, by which light reflectivity of the protective film can be lowered.

In this way, since the protective film is colored with the color, by which the light reflectivity of the protective film can be lowered, the light reflectivity on the bottomed holes and that on the protective film can be greatly differentiated. Therefore, when the surface of the protective film, where the bottomed holes are formed, is inspected by means of the image recognition technology, the states of the bottomed holes and their filling states of the interlayer connective material can be accurately inspected.

DETAILED DESCRIPTION OF THE PREFERRED EMBODIMENT

Hereinafter, embodiments according to this invention will be described with reference to the accompanying drawings.

At first, a method for forming bottomed holes in a base substrate of a multi-layered board applied with a protection film according to this invention and a method for filling the bottomed holes with interlayer connective material will be described. Further, a method for forming the multi-layered board with the use of the base substrate, that is, the manufacturing procedure of the multi-layered board, will be described.

Figure 1A:
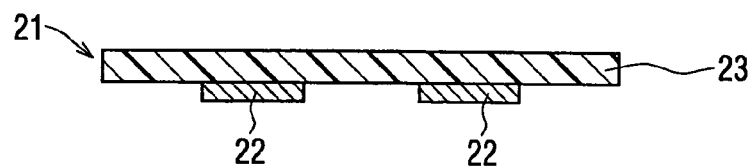
FIGS. 1A to 1E are cross-sectional views, respectively showing a part of manufacturing processes of a multi-layered board with the use of a resin sheet therefor according to this invention.

As shown in FIG. 1A, a resin sheet 21 for a multi-layered board has conductive patterns 22, each of which is attached to one surface of a resin sheet 23 made of a thermoplastic resin. The conductive pattern 22 is made of a conductive foil (a copper foil with 18 μm thickness in this embodiment) in which patterns are formed by etching. A thermoplastic resin sheet with 25–75 μm thickness is employed as the resin sheet 23. The resin sheet 23 is essentially composed of a polyetheretherketone resin 65–35 wt % and a polyetherimide resin 35–65 wt %.

Figure 1B:
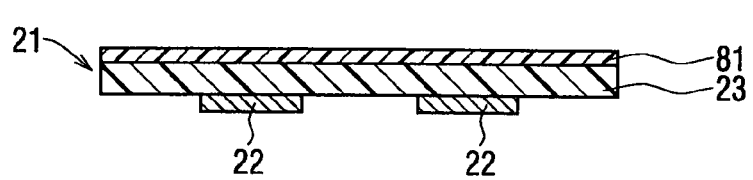

After the conductive patterns 22 have been formed as shown in FIG. 1A, as shown in FIG. 1B, a protective film 81 is laminated on one surface of the resin sheet 21 at a side which is opposite from the surface in which the conductive patterns 22 are formed, by means of a laminating machine.

Figure 3A:
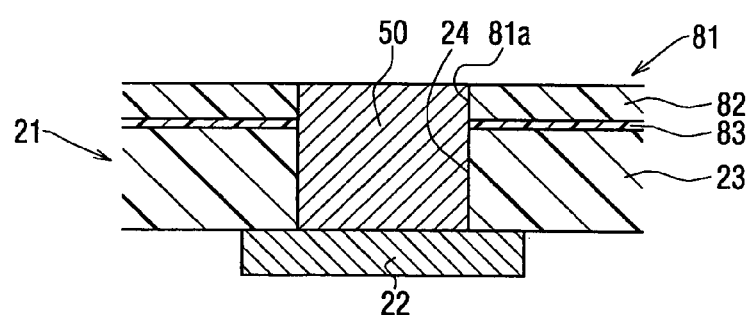
FIGS. 3A and 3B are partial cross-sectional views, respectively showing the states of the multi-layered board before a protective film is detached and after the protective film is detached in the manufacturing processes of the multi-layered board.

Although not shown in FIG. 1B but shown in FIG. 3A, the protective film 81 includes a resin film 82 and an adhesive layer 83. This adhesive layer 83 is coated on the surface of the resin film 82 on a side attached to the resin sheet 23. The adhesive of the adhesive layer 83 is an ultraviolet curable adhesive essentially composed of an acrylate resin. Therefore, when an ultraviolet ray is applied to the adhesive layer 83, bridging reaction proceeds therein. Accordingly, the adhesive force of the adhesive layer 83 is lowered.

In this embodiment, the adhesive of the adhesive layer 83 is mixed with organic colorant so as to be colored. As coloring colors, any colors that can lower the light reflectivity of the protective film 81 may be employed. For example, a color that can make a large difference between the reflectivity of the color and a color of the copper foil, which is a bottom of the via hole 24, can be employed. The coloring colors are desired to be black, blue, green and so on, having a high light absorption.

Moreover, this embodiment employs the protective film 81, where the resin film 82, made of polyethylene terephthalate with 12 μm thickness, is coated with the adhesive layer with 5 μm thickness. When the thickness of the resin film 82 is thinner than 8 μm, the handling of the protective film 81 is hard. Moreover, when the thickness of the resin film 82 exceeds 50 μm, laser output in forming the via holes 24 described later needs to be increased, which will be described later. Moreover, respective contacting areas of the protective film 81 and the conductive paste 50 are enlarged. Therefore, the conductive paste 50 is disadvantageously stressed so much when the protective film 81 is detached. In consideration of these factors, the thickness of the resin film 82 is particularly desired to be about 12 μm.

Figure 1C:
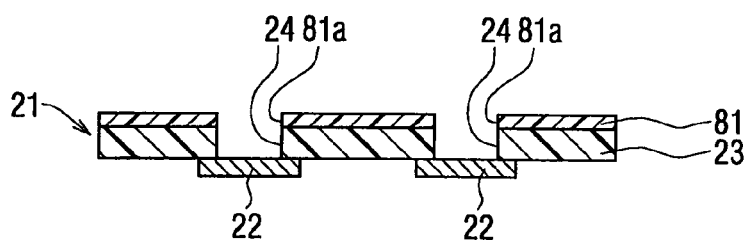

After the protective film 81 has been laminated on the resin sheet 23 as shown in FIG. 1B, $CO_2$ laser is applied to the protective film 81, so that the via holes 24 are formed as shown in FIG. 1C. The via holes 24 are bottomed holes, the bottoms of which are defined by the conductive patterns 22. A part of each conductive pattern 22 that forms the bottom of the corresponding via hole 24 serves as an electrode when the interlayer connection is performed. Moreover, when the via holes 24 are formed, the output level, the application period and so on of the $CO_2$ laser are regulated lest the conductive patterns 22 are bored.

Simultaneously, openings 81a, each diameter of which is substantially the same as that of the corresponding via hole 24, are formed in the protective film 81.

After the $CO_2$ laser has been applied, ultraviolet (UV) laser is applied to the via holes 24. In case a burned resin piece (resin smear) by the $CO_2$ laser is left in the via hole 24, particularly on the conductive pattern 22 at the bottom of the via hole 24, the resin smear disadvantageously causes a trouble in the interlayer connection. Therefore, the resin smear is required to be burned and evaporated by the UV laser.

Moreover, instead of applying the UV laser, a part of each conductive pattern 22, which faces the corresponding via hole 24, may be etched thinly or deoxidized.

Figure 1D:
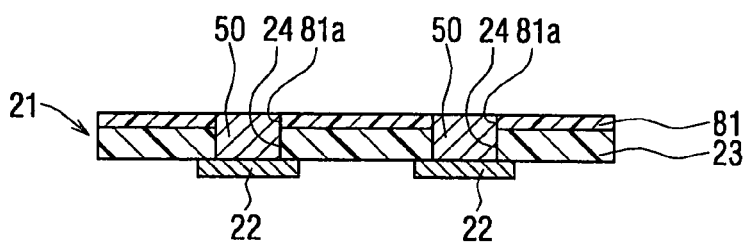

After the via holes 24 have been formed as shown in FIG. 1C, the via holes 24 are filled with the conductive paste 50 serving as interlayer connective material as shown in FIG. 1D. The conductive paste 50 is made of tin particles, silver particles and terpineol serving as organic solvent. The average diameter of the tin particles is 5 μm, and the specific surface area of each tin particle is 0.5 $m^2$/g. The average diameter of the silver particles is 1 μm, and the specific surface area of each silver particle is 1.2 $m^2$/g. 300 g of the tin particles 300 g of the silver particles and 60 g of the terpineol are mixed and kneaded into paste by a mixer, so that the conductive paste 50 is prepared.

By a screen printer and so on, the conductive paste 50 is poured in the respective via holes 24 of the resin sheet 21 through the openings 81a of the protective films 81.

After the conductive paste 50 has been poured in the respective via holes 24, the UV ray is applied to the protective film 81 by an UV ray lamp. Accordingly, the UV ray reaches the conductive layer 83 through the transparent resin film 82, so that the adhesive layer 83 shown in FIG. 3A for the protective film 81 is hardened, and the adhesive force of the adhesive layer 83 is lowered.

Figure 1E:
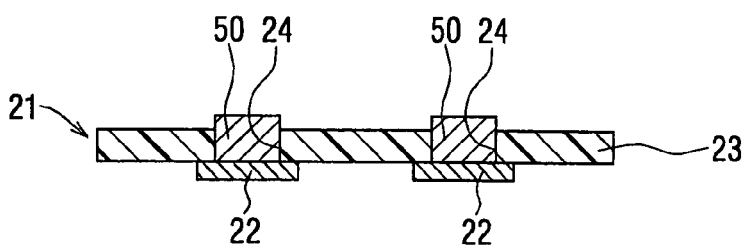
Figure 3B:
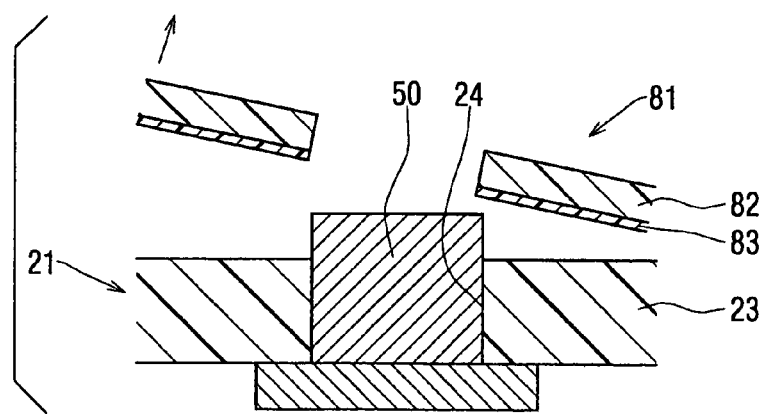

After the UV ray has been applied to the protective film 81, the protective film 81 is detached from the resin sheet 21. Accordingly, the resin sheet 21, in which the via holes 24 are filled with the conductive paste 50 as shown in FIG. 1E, is completed. When the protective film 81 is detached, the adhesive force of the adhesive layer 83 shown in FIG. 3B has been lowered, so that the protective film 81 can be easily detached without stressing the resin sheet 23 excessively.

In this case, when the UV curable adhesive layer is employed as the adhesive layer 83 forming the protective film 81, the adhesive layer need not be heated to lower the adhesive force. Accordingly, the organic solvent of the conductive paste 50 is not forcibly dried. Moreover, since the via holes 24 according to this embodiment are the bottomed holes, the exposed areas of the conductive paste 50 are small, so that the filled conductive paste 50 is less likely to be dried. Therefore, the protective film 81 can be detached from the resin sheet 21 before the organic solvent in the conductive paste 50 has been dried. In this state, the conductive paste 50 keeps retaining its shape. Therefore, it is prevented that a part of the conductive paste 50 is detached when the protective film 81 is detached.

Moreover, in order that the conductive paste 50 retains its shape, it is desired that the conductive paste 50 includes the organic solvent of equal to or more than 6 percent by weight relative to metal particles (tin particles and silver particles in this embodiment).

Figure 2A:
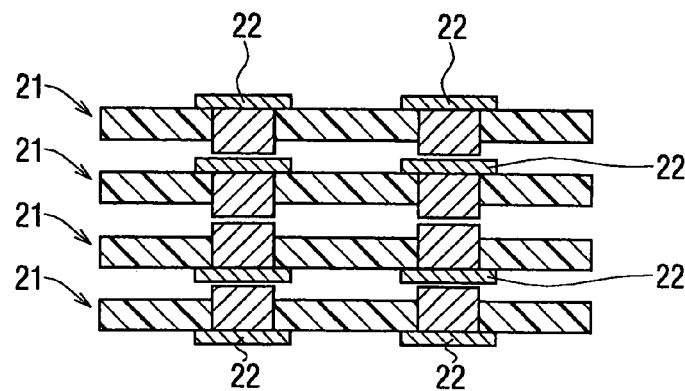
FIGS. 2A and 2B are cross-sectional views, respectively showing the rest of the manufacturing processes of the multi-layered board, successively performed after the process shown in FIG. 1E.

After resin sheet 21 shown in FIG. 1E, in which via holes 24 are filled with the conductive paste 50, has been completed, a plurality of resin sheets 21 (four resin sheets 21 in this embodiment) is laminated as shown in FIG. 2A. In this case, the lower side of each of the lower two resin sheets 21 is a side where the conductive pattern is formed, and the upper side of each of the upper two resin sheets 21 is a side where the conductive pattern is formed.

After the resin sheets 21 have been laminated as shown in FIG. 2A, these laminated resin sheets 21 are heat-pressed in both directions from both upper and lower sides by the use of a vacuum hot press. In this embodiment, the laminated resin sheets 21 are kept to be heated to 250–350° C. and pressed to 1–10 MPa for 10–40 minutes.

Figure 2B:
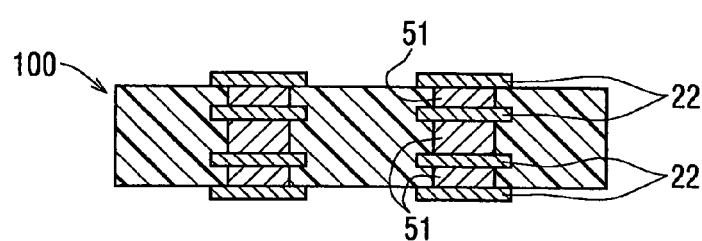

In this way, the resin sheets 21 are adhesively connected one another as shown in FIG. 2B. That is, the resin sheets 23 are heat-bonded so as to be integrated, and the filling in each via hole 24 of the conductive paste 50 is sintered and integrated so as to become an integrated conductive component 51. In this way, a multi-layered board 100, in which adjoining patterns 22 are interlayer-connected, is formed.

Hereinafter, the mechanism of the interlayer connections of the conductive patterns 22 is briefly described. The vacuum hot press depressurizes the conductive paste 50 filled in each via hole 24, and so the terpineol serving as the organic solvent is evaporated and dried. Accordingly, the conductive paste 50 becomes a state where the tin particles and the silver particles are mixed. Moreover, the melting point of the tin particles is 232° C., and the melting point of the silver particles is 961° C. Therefore, when the conductive paste 50 is heated to 250–350° C., the tin particles melt and adhere to cover the surfaces of the silver. The conductive paste 50 continues to be heated in this condition, melted tin starts to diffuse from the surfaces of the silver particles so as to form alloy (480° C. melting point) of tin and silver. In this process, the conductive paste 50 is pressed to 1–10 Mpa. Therefore, in accordance with the formation of the alloy of tin and silver, the conductive component 51, made of the alloy that is integrated by sintering, is formed in each via hole 24. Moreover, the conductive components 51 are pressed to contact the surfaces of the conductive patterns 22, which form the bottoms of the via holes 24. In this way, the tin of the conductive component 51 and the copper of the copper foil, which forms the conductive pattern 22, are solid-phase diffused each other. Accordingly, a solid phase diffused layer is formed between each conductive component 51 and the boundary face of the corresponding conductive pattern 22, so that the conductive component 51 and the conductive pattern 22 are connected electrically.

Next, the inspection apparatus for inspecting the via holes 24 formed in the protective film 81 and the resin sheet 21 will be described.

When the via holes 24 have dusts or remaining smears in the respective insides, or when the copper foils on the bottoms of the via holes 24 are scraped or bored, or when the diameters of the via holes 24 are not equal to the designed values, adjoining conductive patterns 22 cannot be adequately connected, and the reliability of connection is lowered. Similarly, when the via holes 24 are not filled sufficiently with the conductive paste 50 after its filling process, the adjoining patterns 22 are likely to have in sufficient electrical connection.

Accordingly, with the use of the inspection apparatus, after the via holes 24 have been formed in the protective films 81 and the resin sheets 21, or after the via holes 24 have been filled with the conductive paste 50, the states of the via holes 24 and the filling conditions of the conductive paste 50 therein are inspected with the protective films 81 attached on the resin sheets 21 by means of the image recognition technology.

Figure 4:
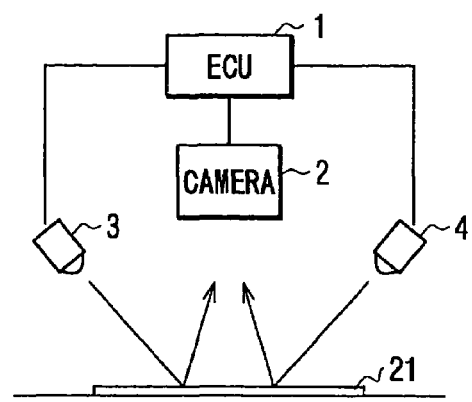
FIG. 4 is a schematic view showing a mechanism of an inspection apparatus according to this embodiment.

FIG. 4 shows the structure of the inspection apparatus. As shown in FIG. 4, the inspection apparatus has lamps 3, 4 for illuminating the resin sheet 21 as an inspective object. An image of the resin sheet 21 is taken by a camera 2 while the lamps 3, 4 illuminate the resin sheet 21, and this image data is output to an ECU 1. The ECU 1 processes the image data input from the camera 2 and thereby determines whether the states of the via holes 24 are proper and the via holes 24 are sufficiently filled with the conductive paste 50. When the ECU 1 determines that they are not appropriate, it is informed to the use by a display device (not shown).

Subsequently, image processing of the ECU 1 will be described. The ECU 1 converts the image data input from the camera 2 into a monochrome image. Accordingly, differences of brilliance are shown in the monochrome image. The light reflectivity of the via hole 24 is higher than that of the protective film 81, and therefore the size of the via hole 24, dusts and remaining smears, or filling amount of the conductive paste 50 are detected.

Figure 5A:
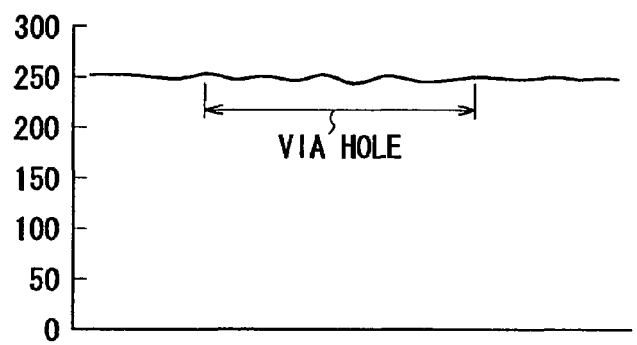
FIGS. 5A, 5B and 5C are respectively a graph, which shows luminance of an image including an area in which via holes are formed when the protective film is not colored, a graph, which shows luminance of an image including an area in which the via holes are formed when the protective film is colored with blue, a graph, which shows luminance of an image including an area in which the via holes are formed when the protective film is colored with green.

However, original colors of the resin film 82 and the adhesive layer 83, both of which form the protective film 81, are transparent or white, so that the difference between the optical reflectivity of the original color and that of the via hole 24 is very small. For example, FIG. 5A shows the brilliance of the image of a part where the via hole 24 is formed when the resin film 82 and the adhesive layer 83 respectively have the original colors. However, the via hole 24 and the protective film 81 have substantially the same brilliance, so that they are very difficult to be distinguished.

Figure 5B:
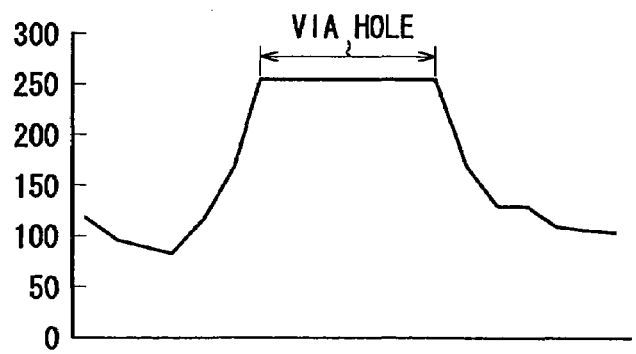
Figure 5C:
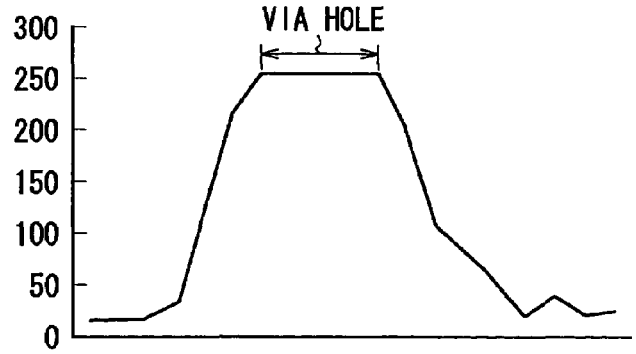

In this embodiment, the adhesive layer 83 of the protective film 81 is colored, so that the light reflectivity of the protective film 81 is lowered, and thereby an obvious difference of the brilliance between the protective film 81 and the via hole 24 is generated on the image. For example, FIG. 5B shows the brilliance of the image of the part where the via hole 24 is formed when the adhesive layer 83 is colored with blue colorant, and FIG. 5C shows the brilliance of the image of the part where the adhesive layer 83 is colored with green colorant. As show in FIGS. 5B and 5C, when the protective film 82 is colored, the difference of the brilliance between the via hole 24 and its circumferential protective film 81 can be obviously generated.

For example, as for the validity of the size of the via hole, it can be determined based on whether the highly brilliant area has a predetermined size. As for the adhering dusts or the lest smears, when the via hole 24 has the dusts or the smears, the brilliance of the via hole 24 is lowered. Therefore, whether the brilliance of the area including the via hole 24 is higher than the predetermined value is judged, so that the adhering dusts and the remaining smears can be found.

Moreover, before the via holes 24 are filled with the conductive paste 50, the light is reflected by the copper foils, which are the bottoms of the via holes 24, so that the high brilliance is shown. Further, even after the conductive paste 50 has been filled, the metal particles (the tin, the silver) of the conductive paste 50 maintains the brilliance of the via holes 24. However, when the bottoms of the via holes 24 are bored, or when the filling amount therein of the conductive paste 50 is not sufficient, the copper foil or the surface of the conductive paste 50 may have concavities, convexities or slopes. Therefore, the brilliance is partially changed.

Accordingly, on the basis of the change of the brilliance, the bores of the copper foils, which form the bottoms of the via holes 24, and inadequate fillings of the conductive paste 50 can be detected.

In the above embodiments, instead of coloring the adhesive layer 83, the colorant may be mixed to the basic ingredient of the resin film 82 so that the resin film 82 is colored. However, with respect to coloring the resin film 82, the adhesive layer 83 is required to be subjected to the UV ray. Therefore, the colorant itself, the mixing amount of the colorant and so on are required to be properly determined so that the resin film 82 should have certain transparency in which a predetermined level of the UV ray can pass through the resin film 82.

Moreover, instead of the film made of polyethylene terephthalate, the resin film 82 of the protective film 81 may be made of polyethylene naphthalate and so on in which boring processes can be performed easily.

Moreover, instead of the resin sheet essentially composed of the polyetheretherketone resin 65–35% by weight and the polyetherimide resin 35–65% by weight, the resin sheet 23 may be made of a film in which non-conductive filler is mixed in the polyetheretherketone resin and the polyetherimide resin, or may be independently made of the polyetheretherketone (PEEP) or the polyetherimide (PEI).

Further, the resin sheet 23 may be made of a thermoplastic resin, such as a thermoplastic polyimide and a liquid crystal polymer. When a resin film has an elastic modulus of 1–1000 Mpa under heating temperature in hot pressing and has heat-durability required in the later soldering process, such a resin film can be suitably employed as the resin sheet 23.

What is claimed is:

1. A protective film for a base substrate of a multi-layered board, the base substrate of a multi-layered board having a conductive pattern formed on one surface thereof, a bottomed hole having a bottom defined by the conductive pattern, and an interlayer connective material filled in the bottomed hole;
    wherein the protective film is attached to the base substrate of the multi-layered board at the other surface opposite from the one surface on which the conductive pattern is formed, the protective film including a resin film having a thickness of about 12 µm and an adhesive layer having a thickness of about 5 µm and an adhesive force, and the adhesive force is lowered when an UV ray is applied thereto;
    wherein the bottomed hole is formed in the base substrate of the multi-layered board and the interlayer connective material is filled in the bottomed hole from a surface side of attaching the protective film to protect the base substrate of the multi-layered board; and
    wherein at least one of the resin film and adhesive layer of the protective film is colored with a color, which reduces light reflectivity thereof.

2. The protective film for a base substrate of a multi-layered board according to claim 1, wherein the protective film is colored by an organic colorant.

3. An inspection apparatus for inspecting a protective film for a base substrate of a multi-layered board, the inspection apparatus comprising:
    an irradiation unit for irradiating light onto the protective film attached to a base substrate of a multi-layered board, the base substrate of a multi-layered board having a conductive pattern formed on one surface thereof, a bottomed hole having a bottom defined by the conductive pattern, and an interlayer connective material filled in the bottomed hole, the protective film being attached to the base substrate of the multi-layered board at another surface opposite from the one surface on which the conductive pattern is formed, the bottomed hole being formed in the base substrate of the multi-layered board, and the interlayer connective material being filled in the bottomed hole from a surface side of attaching the protective film to protect the base substrate of the multi-layered board; and
    an inspection unit for inspecting whether the bottomed hole is acceptable on the basis of a difference of light reflectivity between one of the conductive pattern defining the bottom of the bottomed hole and the interlayer connective material filled in the bottomed hole and the protective film, which is colored with a color that reduces light reflectivity thereof.

4. An inspection method for inspecting a base substrate of a multi-layered board, the inspection method comprising steps of:
    attaching a protective film on one surface of a base substrate of a multi-layered board, wherein the protective film is colored by a color that can lower a light reflectivity of the protective film, and a conductive pattern is formed on the other surface of the base substrate of the multi-layered board;
    forming a bottomed hole in the base substrate of the multi-layered board from a surface side of attaching the protective film with the protective film penetrated through, wherein a bottom of the bottomed hole is the conductive pattern;
    filling interlayer connective material in the bottomed hole, which is formed in the base substrate of the multi-layered board with the protective film penetrated through; and
    inspecting whether a condition of the bottomed hole is acceptable after one of a step in which the bottomed hole is formed and a step in which the interlayer connective material is filled, wherein this inspection is on the basis of a difference between a light reflectivity of the interlayer connective material, which is filled into the bottomed hole, and a light reflectivity of the protective film, which is colored, by means of irradiating light to the protective film.

5. The inspection method for inspecting the base substrate of a multi-layered board according to claim 4 wherein:
    the protective film includes a resin film and an adhesive layer, in which adhesive force of the adhesive layer is lowered when an UV ray is applied to the adhesive layer; and
    one of the resin film and the adhesive layer is colored.

6. The inspection method for inspecting the base substrate of a multi-layered board according to claim 4, the inspection method further comprising one step after the steps, the one step detaching the protective film from the base substrate of the multi-layered board in a state where adhesive force of the protective film is lowered by means of applying an UV ray to the protective film.

7. The inspection method for inspecting the base substrate of a multi-layered board according to claim 6, wherein the protective film is colored with an organic colorant.

8. An assembly for a multi-layered board comprising:
    a base substrate;
    a conductive pattern formed on one surface of the base substrate;

a protective film detachably attached to the base substrate at the other surface opposite from the one surface on which the conductive pattern is formed; and an interlayer connective material filled in a via hole formed through the base substrate and the protective film and closed by the conductive pattern, wherein the protective film is colored to have a light reflectivity lower than that of the interlayer connecting material;

wherein the protective film includes a resin film of 8 μm to 50 μm and an adhesive layer for detachably attaching the resin film to the base substrate; and wherein the adhesive layer is curable by UV so that the protective film is made detachable.

9. The assembly according to claim 8, wherein the resin film has a thickness of about 12 μm and the adhesive layer has a thickness of about 5 μm.

10. A method of using a protective film, which is curable by UV ray and colored to have a reduced light reflectivity, the method comprising:

providing an assembly of a base substrate having a conductive pattern formed on one surface of the base substrate;

attaching the protective film to the base substrate at the other surface opposite from the one surface on which the conductive pattern is formed;

forming a via hole through the protective film and the base substrate so that an interlayer connective material is filled therein, the via hole being closed by the conductive pattern;

inspecting the via hole by illuminating the protective film and the via hole with light and comparing reflection of light by the protective film and the via hole;

applying the UV ray to the protective film to reduce adhesive force of the protective film after an inspection of the via hole; and detaching the protective film from the base substrate.

11. The method according to claim 10, further comprising: filling interlayer conductive material in the via hole before the inspection of the vial hole, the interlayer protective material having a light reflectivity higher than that of the protective film.

12. The method according to claim 10, wherein the protective film includes a resin film and an adhesive layer, which attaches the resin film to the base substrate and reduces adhesive force thereof when the UV ray is applied.

13. The method according to claim 12, wherein the resin film has a thickness of about 12 μm and the adhesive layer has a thickness of about 5 μm.

* * * * *